United States Patent
Hu et al.

(10) Patent No.: US 11,220,422 B2
(45) Date of Patent: Jan. 11, 2022

(54) MEMS DEVICE

(71) Applicant: TAIWAN SEMICONDUCTOR MANUFACTURING COMPANY LTD., Hsinchu (TW)

(72) Inventors: Fan Hu, Taipei (TW); Wen-Chuan Tai, Hsinchu (TW); Hsiang-Fu Chen, Hsinchu County (TW); Chun-Ren Cheng, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 70 days.

(21) Appl. No.: 16/353,484

(22) Filed: Mar. 14, 2019

(65) Prior Publication Data

US 2020/0290863 A1 Sep. 17, 2020

(51) Int. Cl.
*B81B 3/00* (2006.01)
*G01C 19/5656* (2012.01)

(52) U.S. Cl.
CPC .......... *B81B 3/001* (2013.01); *G01C 19/5656* (2013.01); *B81B 2203/0118* (2013.01)

(58) Field of Classification Search
CPC ..... H01L 27/20; G01C 19/5656; B81B 3/001; B81B 2203/0118
See application file for complete search history.

(56) References Cited

U.S. PATENT DOCUMENTS

| | | | | |
|---|---|---|---|---|
| 6,196,067 B1* | 3/2001 | Martin | ................ | G01P 15/0802 73/514.32 |
| 7,696,673 B1* | 4/2010 | Yavid | ...................... | H02N 2/18 310/339 |
| 2002/0050881 A1* | 5/2002 | Hyman | .................... | H01G 5/40 335/78 |
| 2007/0231065 A1* | 10/2007 | Kim | ....................... | H01H 57/00 403/359.1 |
| 2011/0062003 A1* | 3/2011 | Srinivasan | ............. | H01H 1/021 200/275 |
| 2011/0148251 A1* | 6/2011 | Piazza | ................... | H01L 41/094 310/317 |
| 2013/0283922 A1* | 10/2013 | Qualtieri | ................ | H01L 41/27 73/774 |
| 2018/0006208 A1* | 1/2018 | Eid | ........................ | G06F 1/1633 |
| 2019/0182573 A1* | 6/2019 | Shin | ...................... | G06F 1/1616 |
| 2019/0226847 A1* | 7/2019 | Scheirich | .................. | G01P 3/44 |

* cited by examiner

*Primary Examiner* — Christine A Enad

(74) *Attorney, Agent, or Firm* — WPAT, P.C., Intellectual Property Attorneys; Anthony King

(57) ABSTRACT

A micro-electro-mechanical system (MEMS) device includes a substrate, a proof mass, and a piezoelectric bump. The substrate has a surface. The proof mass is suspended over the surface of the substrate, wherein the proof mass is movable with respect to the substrate. The piezoelectric bump is disposed on the surface of the substrate and extends a distance from the surface of the substrate toward the proof mass.

20 Claims, 19 Drawing Sheets

MEMS DEVICE

BACKGROUND

Micro-electro-mechanical system (MEMS) devices have been recently developed and have become important components in many types of electronic equipment. The MEMS device is a micro-sized device, and may include movable elements for achieving electro-mechanical functionality. MEMS devices are widely used in various applications such as motion sensors, pressure sensors, printer nozzles and the like. However, there is a reliability problem commonly observed with MEMS devices caused by the adhesion of contacting surfaces due to surface stiction.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
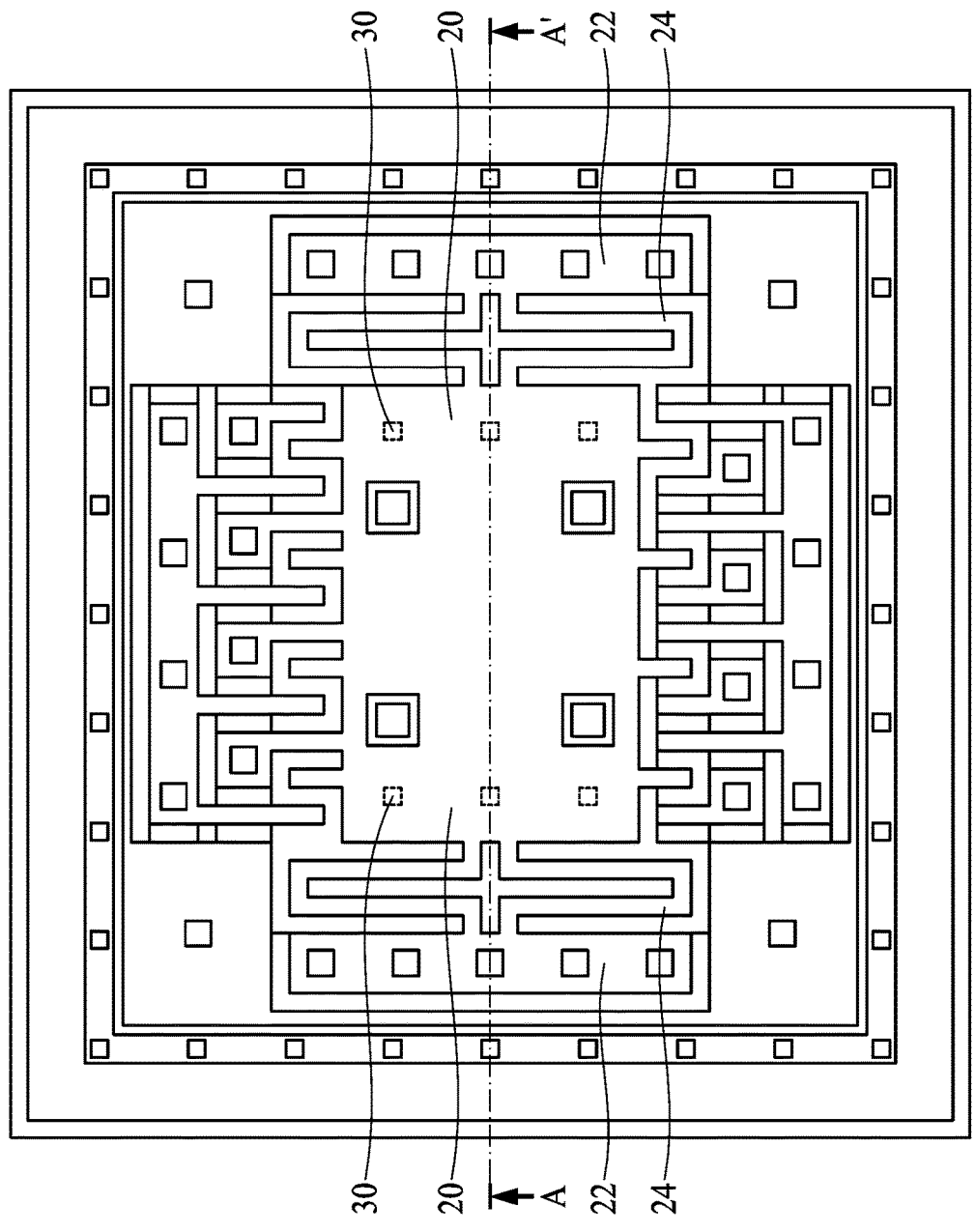
FIG. 1A is a schematic top view of a MEMS device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1% or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the like disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Because it includes moving parts, a micro-electro-mechanical system (MEMS) device has several production challenges that are not encountered during production of CMOS circuits. One significant challenge with MEMS devices is surface stiction. Surface stiction refers to the tendency of a movable MEMS part to stick to a neighboring surface when the movable MEMS part comes into contact with the neighboring surface. The stiction causes the movable part to become stuck to the neighboring surface, resulting in poor reliability of the MEMS device.

In some embodiments of the present disclosure, a MEMS device includes a first structure, a second structure opposite to the first structure, and a vibration bump. At least one of the first structure and the second structure is movable with respect to the other, and the vibration bump is disposed between the first structure and the second structure. The vibration bump is able to vibrate, at least when contacting one of the first structure and the second structure, and thus can serve to separate the first structure and the second structure to alleviate the stiction issue.

In some embodiments of the present disclosure, the vibration bump has piezoelectric property, and may also be referred to as a piezoelectric bump. To be specific, the piezoelectric bump may generate a piezoelectric effect to convert an electrical energy into a mechanical energy or to convert a mechanical energy into an electrical energy when the piezoelectric bump is compressed or when a voltage potential is applied to the piezoelectric bump. Therefore, the piezoelectric bump helps mitigate the stiction issue.

In some embodiments, the MEMS device 100 includes a motion sensor device able to sense motion, an accelerometer device able to sense acceleration or deceleration, a gyroscope device able to sense angular velocity, or another device with a movable structure. In some embodiments, the device is a single-axis MEMS device able to sense motion, acceleration or angular velocity in a single direction (e.g., Z direction). In some other embodiments, the device is a double-axis MEMS device able to sense motion, acceleration or angular velocity in two directions (e.g., X, Z directions). In still other embodiments, the device is a triple-axis MEMS device able to sense motion, acceleration or angular velocity in three directions (e.g., X, Y, Z directions).

Figure 1B:
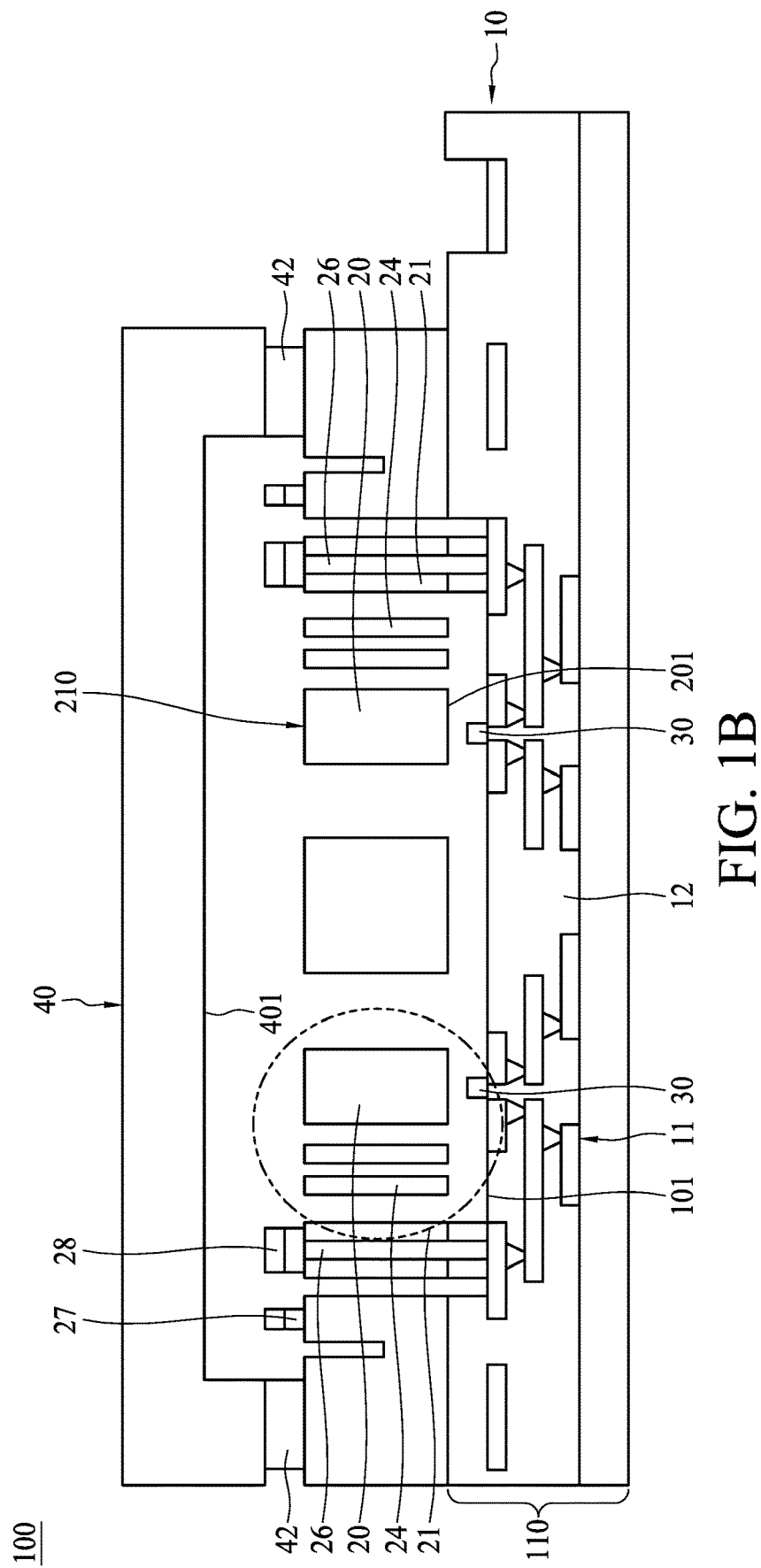
FIG. 1B is a schematic cross-sectional view taken along line A-A' of FIG. 1A.
Figure 1C:
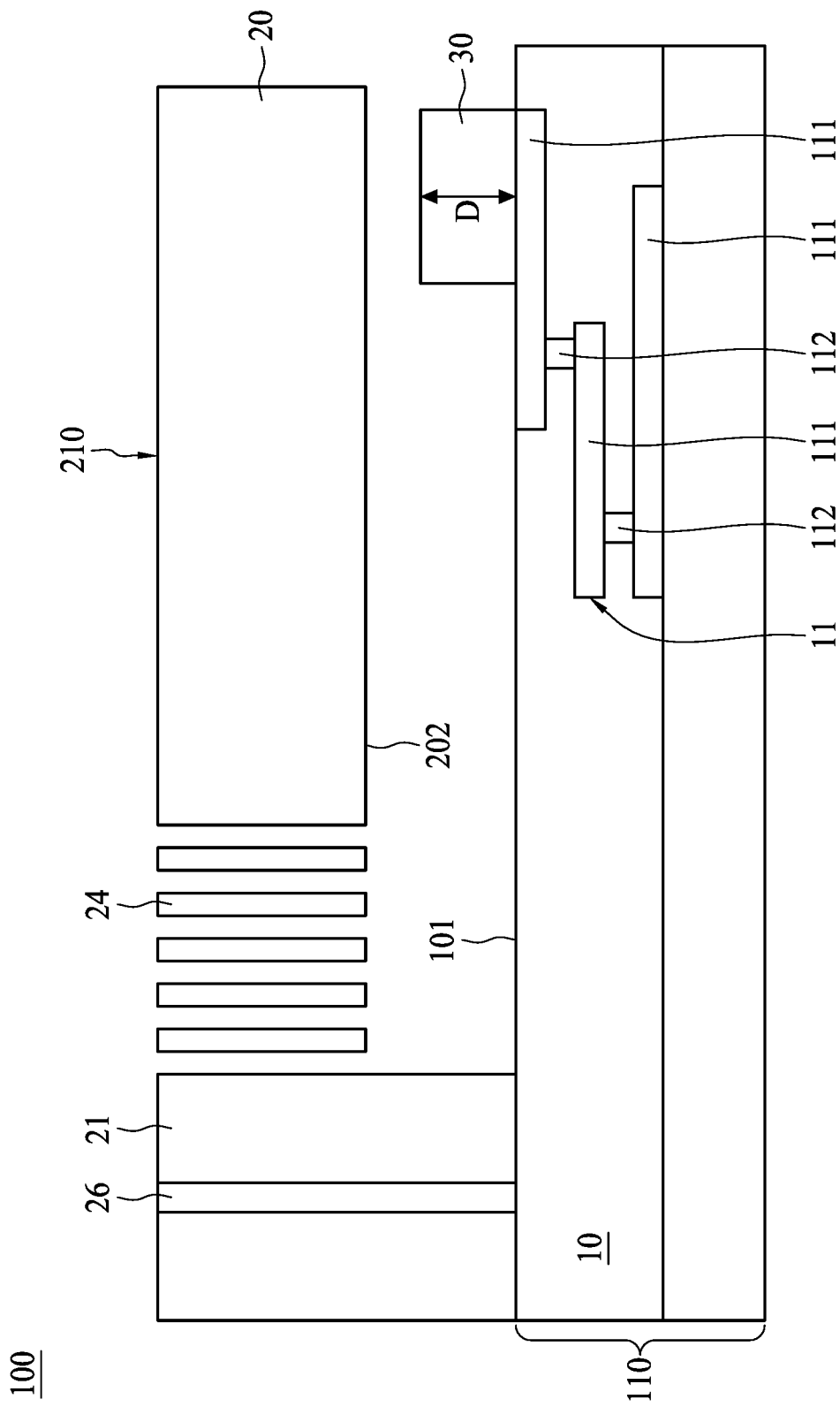
FIG. 1C is an enlarged cross-sectional view of some embodiments of a device corresponding to FIG. 1B.

FIG. 1A is a schematic top view illustrating a MEMS device 100 according to aspects of the present disclosure in some embodiments. FIG. 1B is a schematic cross-sectional view taken along line A-A' of FIG. 1A. FIG. 1C is a partial cross-sectional view of some embodiments of the MEMS device 100 corresponding to FIG. 1B. As shown in FIGS. 1A, 1B and 1C, the MEMS device 100 includes a first structure 110, a second structure 210 opposite to the first structure 110, and a vibration bump 30 disposed between the first structure 110 and the second structure 210. In some embodiments, the first structure 110 is configured to process or transmit signals. The first structure 110 may include circuits, memory cells or other electrical components. In some embodiments, the second structure 210 is configured to perform specific functions such as motion sensing, pressure sensing, acceleration/deceleration sensing or the like, and to communicate with neighboring components. The vibration bump 30 is configured to prevent the first structure 110 and the second structure 210 from making contact with each other.

In some embodiments, the first structure 110 may also be referred to as a first substrate 10, and the second structure 210 may also be referred to as a proof mass 20. The first substrate 10 has a first surface 101, and the proof mass 20 is suspended over the first substrate 10 separated by a space and movable with respect to the first substrate 10. In some embodiments, the proof mass 20 has a second surface 202 facing the first surface 101 of the first substrate 10.

The vibration bump 30 may also be referred to as a piezoelectric bump 30. In some embodiments, the piezoelectric bump 30 is disposed on the first surface 101 of the first substrate 10 and in a path reachable by the proof mass 20, and extends a distance D from the first surface 101 of the first substrate 10 toward the proof mass 20.

In some embodiments, the first substrate 10 includes a semiconductor substrate, such as a bulk semiconductor substrate. In some embodiments, the first substrate 10 includes a composite substrate, such as a silicon-on-insulator (SOI) substrate, which includes a bottom semiconductor layer, a buried oxide layer (BOX) and a top semiconductor layer. In some embodiments, the first substrate 10 is a doped semiconductor substrate. In some embodiments, the first substrate 10 may include a myriad of passive or active components (not shown) electrically connected to a first conductive structure 11 disposed in the first substrate 10.

The first conductive structure 11 may be configured to electrically couple some of the electrical components in the first substrate 10 to other electrical components, wherein the other electrical components are either in the first substrate 10 or external to the first substrate 10. In some embodiments, the first conductive structure 11 is formed on a base material of the first substrate 10. In some embodiments, the first conductive structure 11 is configured to electrically couple the piezoelectric bump 30 to a device or component external to the first substrate 10. The first conductive structure 11 may include multiple conductive layers such as metal layers 111. Each of the metal layers 111 may be electrically coupled to an adjacent overlaying or underlying metal layer 111 through at least one conductive via such as a metal via 112. The numbers of metal layers 111 and metal vias 112 are not particularly limited. The signal can be transmitted from the piezoelectric bump 30 to the first conductive structure 11, and/or transmitted from the first conductive structure 11 to the piezoelectric bump 30.

In some embodiments, insulating material such as intermetal dielectric (IMD) 12 may be disposed between metal layers 111. The dielectric material of the IMD 12 may be, but is not limited to, formed of oxides, such as un-doped silicate glass (USG) or fluorinated silicate glass (FSG), low-k dielectric materials, or the like.

In some embodiments, a fulcrum 21 is disposed on the first substrate 10 to connect the proof mass 20 to the first substrate 10, and the proof mass 20 can rotate about the fulcrum 21. The fulcrum 21 may be fixed on the first substrate 10 and away from the center of gravity of the proof mass 20. In some embodiments, the MEMS device 100 further includes a resilient structure 24 connecting the proof mass 20 to the fulcrum 21. For example, the fulcrum 21 is fixed on the first substrate 10, and the resilient structure 24 is connected to the proof mass 20 and the fulcrum 21. In some embodiments, the proof mass 20 may be an inertial structure having a mass greater than that of the resilient structure 24 such that the proof mass 20 can move due to inertial effect.

In some embodiments, a conductive via 26 is disposed in the fulcrum 21. In some embodiments, the conductive via 26 is configured to electrically connect the fulcrum 21 to the first conductive structure 11. In some embodiments, a conductive element 27 is disposed on and electrically connected to the conductive via 26. In some embodiments, a protective layer 28 is disposed on the conductive element 27.

In some embodiments, the resilient structure 24 is suspended over the first substrate 10 and separated from the first substrate 10 by a space. In some embodiments, the resilient structure 24 is a flexible structure or an elastic structure, which allows the resilient structure 24 to extend, compress or deform to a certain degree. In some embodiments, the resilient structure 24 is a spring. One of the ends of the resilient structure 24 is directly or indirectly coupled to the fulcrum 21, while another one of the ends is directly or indirectly coupled to the proof mass 20. In some embodiments, the resilient structure 24 anchors the proof mass 20 to the fulcrum 21. In some embodiments, a plurality of resilient structures 24 are coupled to different sides of the fulcrum 21, or coupled to different fulcrums 21. The resilient structure 24 is configured to allow the proof mass 20 to move or swing in a Z direction (e.g., a direction substantially perpendicular to the first surface 101 of the substrate 10), a Y direction (e.g., a direction substantially parallel to the first surface 101 of the substrate 10), and/or an X direction (e.g., a direction substantially parallel to the first surface 101 of the substrate 10 and perpendicular to the Y direction) due to an inertial effect when the MEMS device 100 undergoes a force, an acceleration, a deceleration, a vibration, an impact or the like.

In some embodiments, the proof mass 20 is configured to induce a variable capacitance or resistance in response to changes of a signal. In some embodiments, the proof mass 20 includes a conductive material such as metal or alloy. In some embodiments, the proof mass 20 includes a highly doped semiconductor material such as highly doped silicon. In some embodiments, the material of the proof mass 20 may include dielectric material such as silicon oxide, silicon nitride, silicon oxynitride, or any other suitable material with a conductive film formed thereon.

In some embodiments, the fulcrum 21 and the resilient structure 24 may be formed of the same material as the proof mass 20, and may be formed monolithically. In some embodiments, the proof mass 20, the resilient structure 24 and the fulcrum 21 can be a semiconductor layer, a stack of semiconductor layers, a dielectric layer, a stack of dielectric layers, or combinations thereof.

In some embodiments, the MEMS device 100 further comprises a cover 40 over and separated from the proof mass 20, and opposite to the first substrate 10. In some embodiments, the first substrate 10 and the cover 40 collectively enclose the proof mass 20 and the piezoelectric bump 30. The cover 40 has an inner surface 401 facing the proof mass 20. In some embodiments, the material of the cover 40 includes dielectric material such as silicon oxide, silicon nitride, silicon oxynitride, or any other suitable material. In some other embodiments, the material of the cover 40 may include a conductive material such as a highly doped semiconductor material. The first substrate 10 and the cover 40 may be formed of the same material. In some embodiments, a bonding portion 42 is disposed between the cover 40 and the first substrate 10 and configured to bond the substrate 10 to the cover 40. The bonding portion 42 may be formed with conductive materials such as metals, and the bonding portion 42 can be used to transmit signals between the cover 40 and the proof mass 20. The metal may include, for example, gold, silver, aluminum, titanium, copper, tungsten, nickel, chromium, or an alloy, oxide or nitride thereof.

The piezoelectric bump 30 is configured to separate the first substrate 10 and the proof mass 20. In some embodiments, the piezoelectric bump 30 is disposed between the first surface 101 of the first substrate 10 and the second surface 202 of the proof mass 20, or any suitable position as required. By way of example, the piezoelectric bump 30 is disposed on the first surface 101 of the substrate 10 and is in a path reachable by the proof mass 20. The number of piezoelectric bumps 30 is not particularly limited. Furthermore, the proof mass 20 may be, but is not limited to, generally rectangular from a top view. In some embodiments, a plurality of piezoelectric bumps 30 are arranged on the first surface 101 of the first substrate 10 at respective corners of the proof mass 20. Other configurations can also be employed. The piezoelectric bump 30 extends a distance D from the first surface 101 of the first substrate 10 toward the proof mass 20, and is electrically connected to the first conductive structure 11. The distance D may be determined based on the gap between the first surface 101 of the substrate 10 and the second surface 202 of the proof mass 20, as long as the proof mass 20 can operate normally. In some embodiments, the distance D is less than, but not limited to, about 20,000 Å.

The piezoelectric bump 30 may include a first electrode 31, a second electrode 32, and a piezoelectric feature 33 between the first electrode 31 and the second electrode 32. Each of the first electrode 31 and the second electrode 32 is formed with conductive materials, such as metal or alloy. By way of example, the metal includes gold, silver, aluminum, titanium, copper, tungsten, nickel, chromium or an alloy thereof. The material of the first electrode 31 and the second electrode 32 may be the same or different. The piezoelectric feature 33 may include a piezoelectric material. By way of example, the piezoelectric material may include, but is not limited to, $BaTiO_3$, PZT, $KNbO_3$, $Na_2WO_3$, $Ba_2NaNb_5O_5$, $Pb_2KNb_5O_{15}$, ZnO, $La_3Ga_5SiO_{14}$, $GaPO_4$, $LiNbO_3$, $LiTaO_3$, or a combination thereof.

The piezoelectric bump 30 is a vibration bump, so that one of the first substrate 10 or the proof mass 20 does not stick to the piezoelectric bump 30. To be specific, the piezoelectric bump 30 has piezoelectric property. When the piezoelectric effect occurs, the piezoelectric bump 30 converts the electrical signal into mechanical energy, and vibrates to push away one of the first substrate 10 and the proof mass 20 from the other. Taking the MEMS device 100 shown in FIG. 1C for example, the piezoelectric bump 30 is disposed on the first surface 101 of the first substrate 10, wherein the proof mass 20 may move toward the first substrate 10 and be pushed away by the piezoelectric bump 30. In some embodiments, the piezoelectric bump 30 may receive a signal from the proof mass 20 when the proof mass 20 comes in contact with the piezoelectric bump 30, and the piezoelectric bump 30 may start to vibrate. In some other embodiments, the piezoelectric bump 30 may receive a signal from the first conductive structure 11, and vibrates whether the piezoelectric bump 30 is in contact with the proof mass 20 or not. When the proof mass 20 contacts the piezoelectric bump 30, the piezoelectric bump 30 continuously vibrates and pushes the proof mass 20 away to alleviate stiction. In some other embodiments, the piezoelectric bump 30 is not provided with an electrical signal. The piezoelectric bump 30 may be compressed by the proof mass 20, and starts to vibrate when the mechanical energy due to compression converts to electrical energy.

Figure 2A:
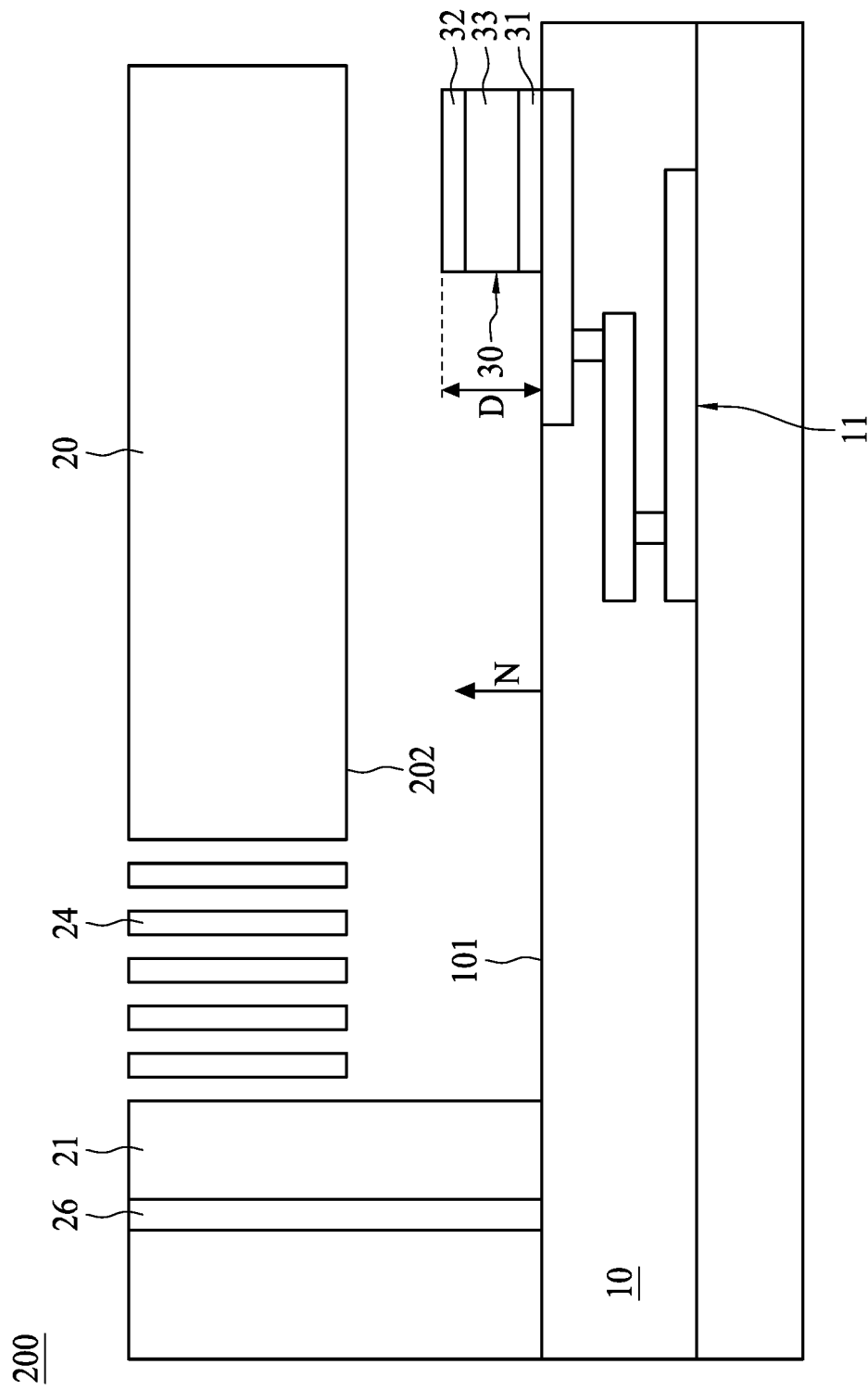
FIGS. 2A to 2C are partial schematic cross-sectional views of a MEMS device in accordance with some embodiments of the present disclosure.
Figure 2B:
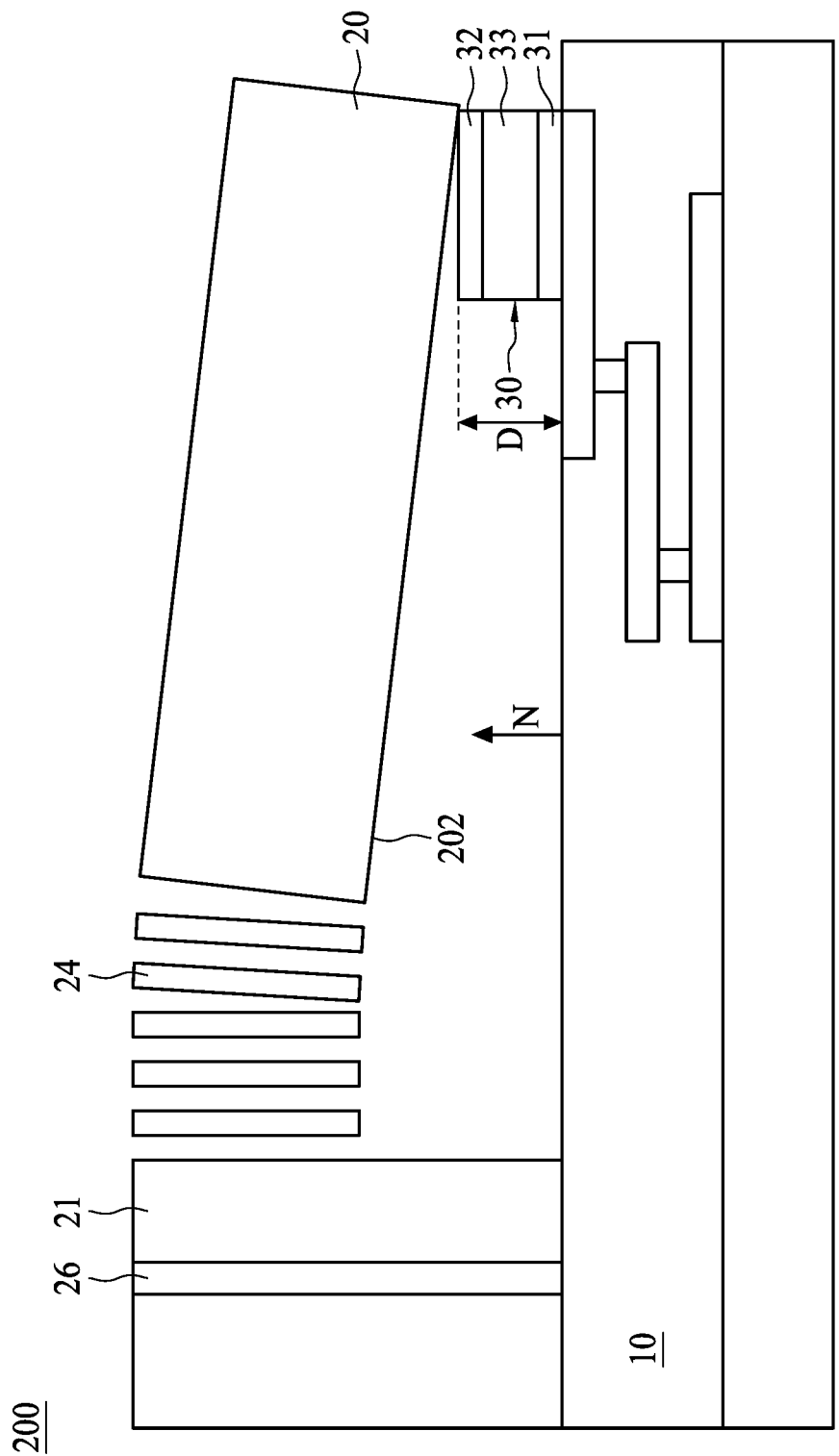
Figure 2C:
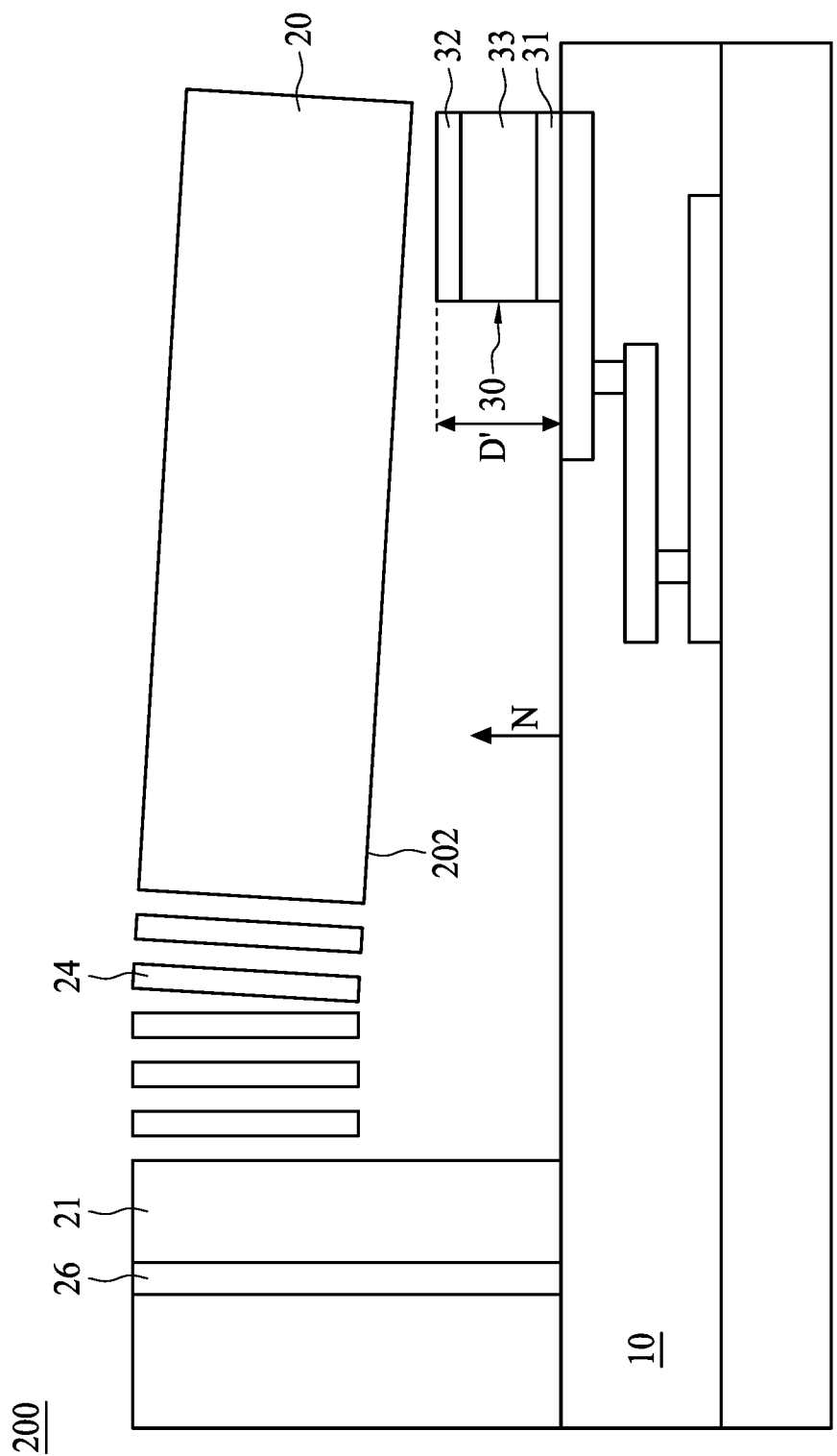

FIGS. 2A to 2C are partial cross-sectional views illustrating a MEMS device 200 according to aspects of the present disclosure in some embodiments. In some embodiments, as shown in FIG. 2A, the first electrode 31, the second electrode 32 and the piezoelectric feature 33 of the piezoelectric bump 30 are stacked in a direction substantially perpendicular to the surface 101 of the substrate 10. In some embodiments, each of the first electrode 31 and the second electrode 32 may individually have a thickness between but not limited to about 100 Å and about 2000 Å. In some embodiments, the piezoelectric feature 33 may have a thickness between but not limited to about 2000 Å and 10000 Å.

As shown in FIG. 2B, the proof mass 20 may move toward the first substrate 10 and make contact with the piezoelectric bump 30. When the piezoelectric bump 30 is compressed by the first substrate 10 and the proof mass 20, the piezoelectric effect occurs, and the piezoelectric bump 30 is driven to vibrate. As shown in FIG. 2C, when the piezoelectric effect occurs, the thickness of the piezoelectric bump 30 increases to a thickened distance D' from the first surface 101 of the first substrate 10 toward the proof mass 20. The thickened distance D' is greater than the distance D. The vibration of the piezoelectric bump 30 helps push away the proof mass 20.

In some embodiments, the first electrode 31 and the second electrode 32 are separated from each other, and configured to receive different signals. By way of example, the first electrode 31 is electrically connected to the first conductive structure 11 to receive an electrical signal, and the second electrode 32 is electrically connected to the proof mass 20 to receive another electrical signal when the proof mass 20 and the piezoelectric bump 30 are in contact. The voltage potential between the first electrode 31 and the second electrode 32 can induce the piezoelectric effect in the piezoelectric feature 33, generating vibration to push the proof mass 20 away from the first substrate 10.

In some other embodiments, the first substrate 10 further includes a second conductive structure (not shown), the first electrode 31 is electrically connected to the first conductive structure 11 to receive an electrical signal, and the second electrode 32 is electrically connected to the second conductive structure to receive another electrical signal. The voltage potential between the first electrode 31 and the second electrode 32 can induce the piezoelectric effect in the piezoelectric feature 33, generating vibration to push the proof mass 20 away from the first substrate 10.

Figure 3:
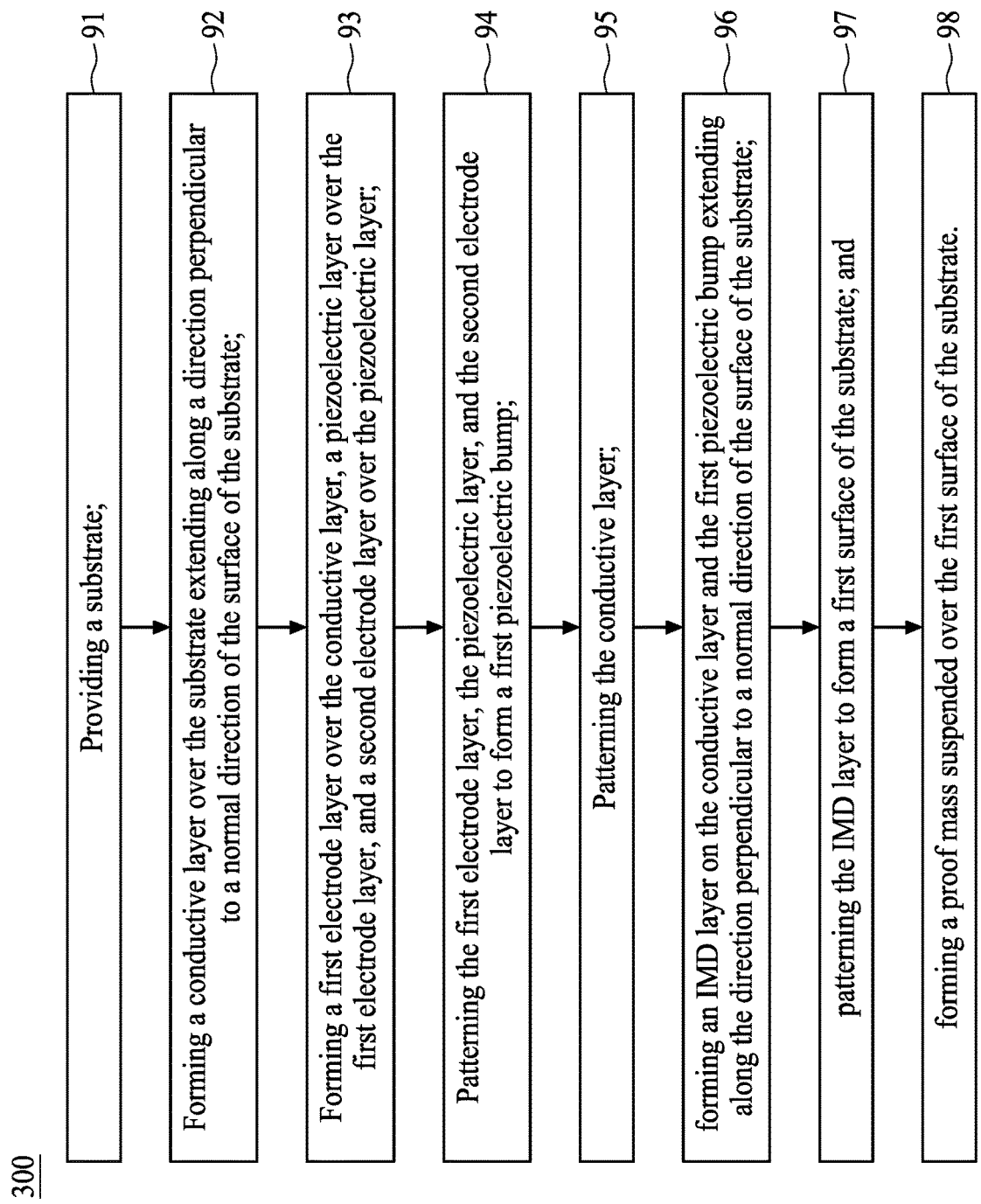
FIG. 3 is a flowchart representing a method for manufacturing a MEMS device in accordance with some embodiments of the present disclosure.

In some embodiments, the MEMS device 200 illustrated in FIGS. 2A to 2C is manufactured by the following method. FIG. 3 is a flowchart depicting an embodiment of a method 300 of manufacturing the MEMS device 200. The method 300 includes operations 91, 92, 93, 94, 95, 96, 97 and 98. FIGS. 4A to 4G are cross-sectional views illustrating exemplary operations for manufacturing a MEMS device 200 of the present disclosure.

Figure 4A:
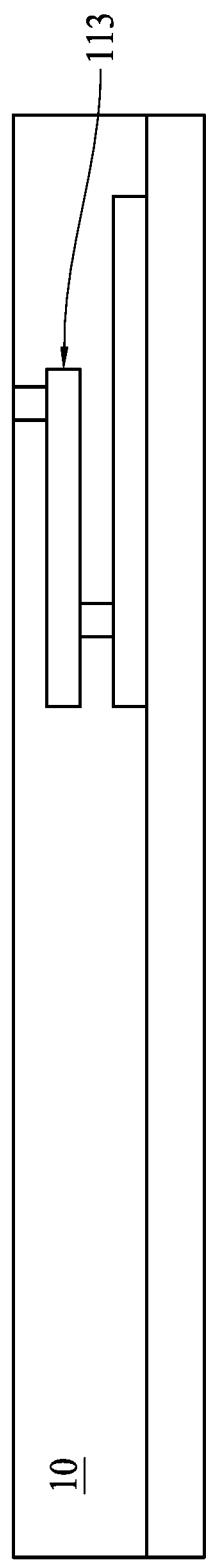
FIGS. 4A to 4G are partial cross-sectional views of a MEMS device manufactured at various stages in accordance with some embodiments of the present disclosure.

In operation 91, a first substrate 10 is provided as shown in FIG. 4A. The first substrate 10 includes an inner conductive structure 113.

Figure 4B:
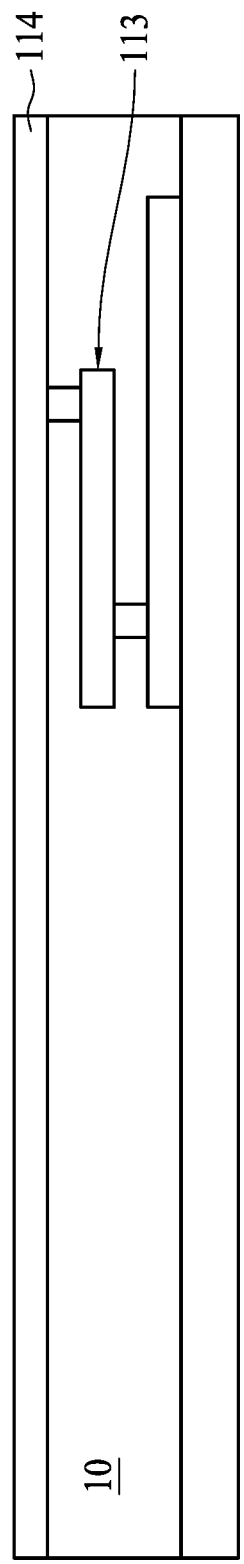

In operation 92, as shown in FIG. 4B, a conductive layer 114 is formed over the surface of the first substrate 10.

Figure 4C:
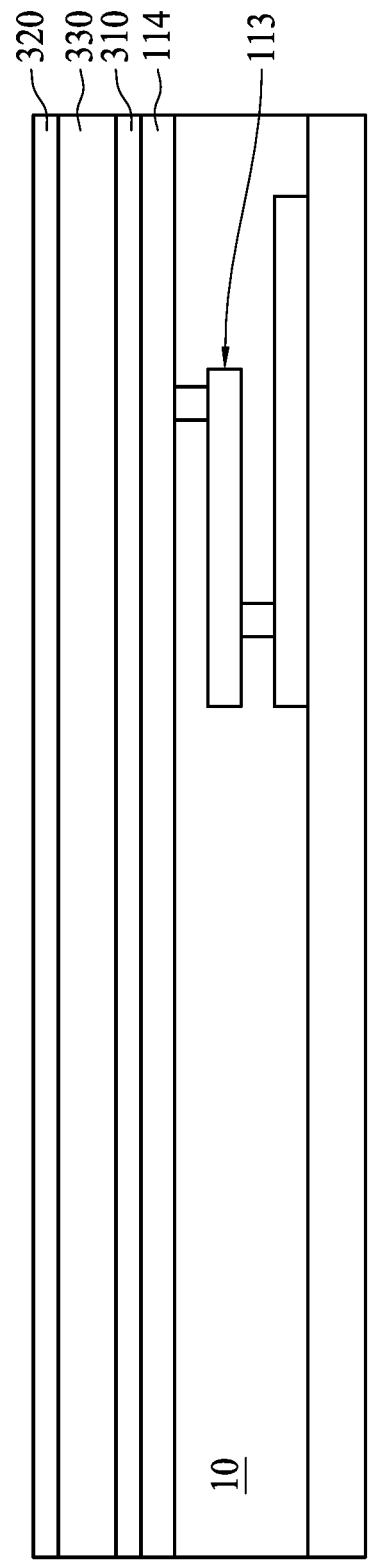

In operation 93, as shown in FIG. 4C, a first electrode layer 310 is formed over the conductive layer 114, a piezoelectric layer 330 is formed over the first electrode layer 310, and a second electrode layer 320 is formed over the piezoelectric layer 330.

Figure 4D:
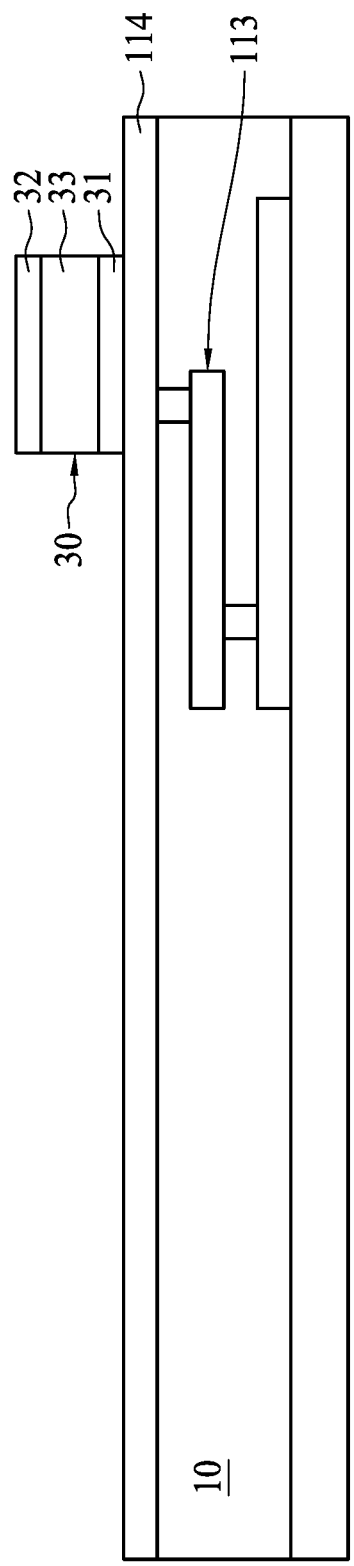

In operation 94, a piezoelectric bump 30 is formed as shown in FIG. 4D. The piezoelectric bump 30 may be formed by patterning the first electrode layer 310, the piezoelectric layer 330 and the second electrode layer 320.

Figure 4E:
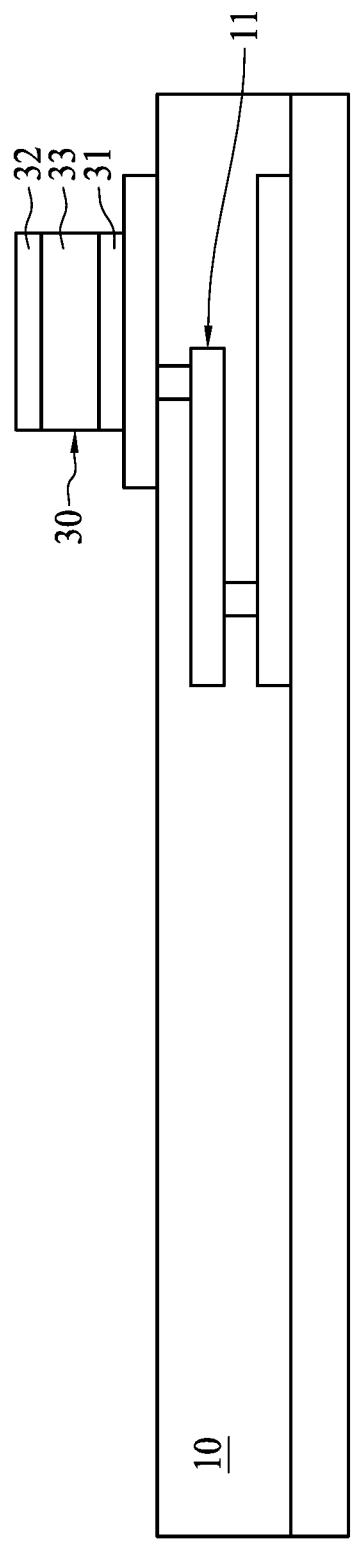

In operation 95, the conductive layer 114 is patterned as shown in FIG. 4E. In some embodiments, the remaining portion of the conductive layer 114 is electrically connected to the piezoelectric bump 30. In some embodiments, the remaining portion of the conductive layer 114 and the inner conductive structure 113 are electrically connected to form the first conductive structure 11.

Figure 4F:
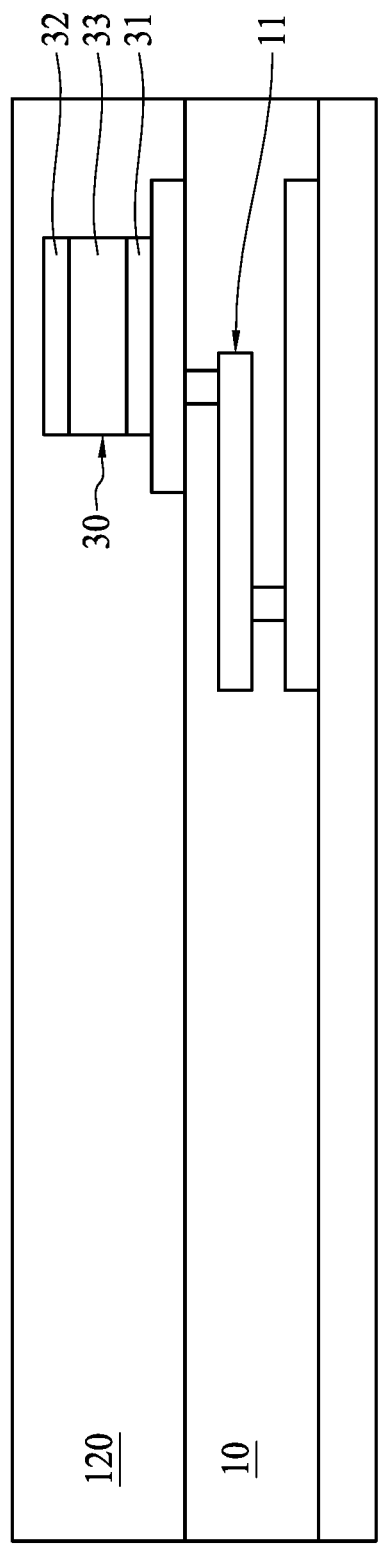

In operation 96, an IMD layer 120 is formed as shown in FIG. 4F. The IMD layer 120 is formed over the first conductive structure 11 and the piezoelectric bump 30.

Figure 4G:
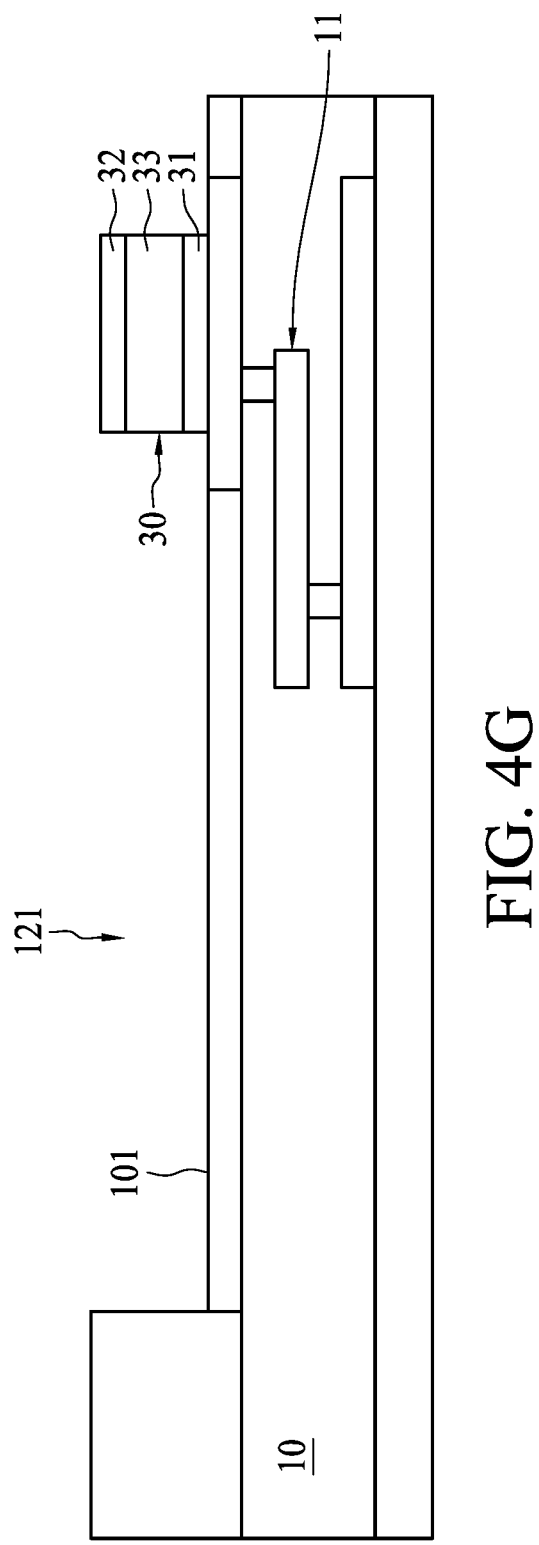

In operation 97, a recess 121 is formed in the IMD layer 120 as shown in FIG. 4G. The recess 121 may be formed by removing portions of the IMD layer 120. The recess 121 exposes at least a portion of the piezoelectric bump 30 and the bottom of the recess 121 defines the first surface 101 of the first substrate 10. In some embodiments, the piezoelectric bump 30 extends a distance D from the first surface 101 of the first substrate 10. In some embodiments, the recess 121 includes a space for the subsequent formation of a proof mass 20.

In operation 98, a proof mass is formed. The proof mass 20 is suspended over the first surface 101 of the first substrate 10, and is movable with respect to the first substrate 10.

Figure 5A:
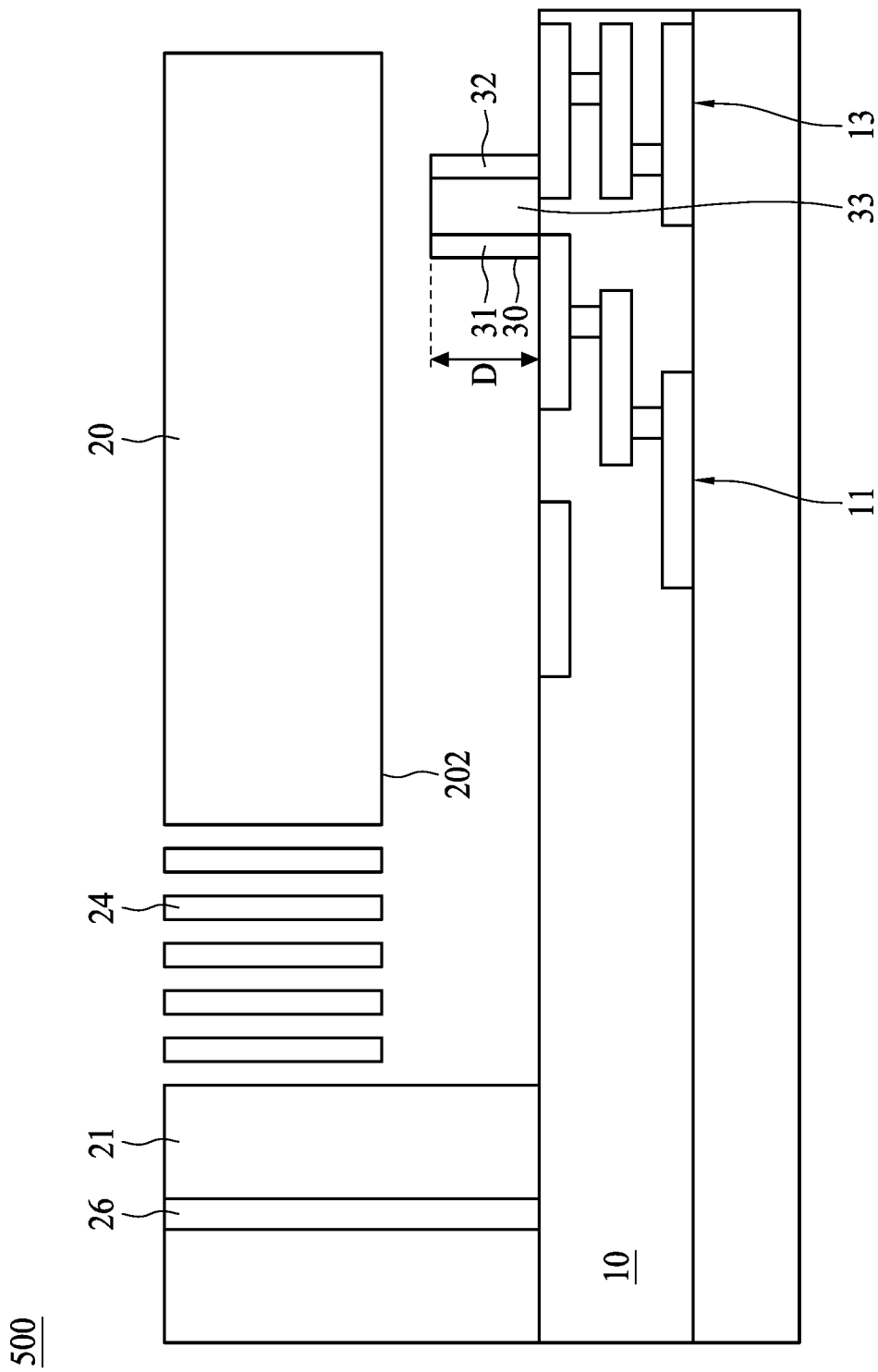
FIGS. 5A to 5C are partial schematic cross-sectional views of a MEMS device in accordance with some embodiments of the present disclosure.
Figure 5B:
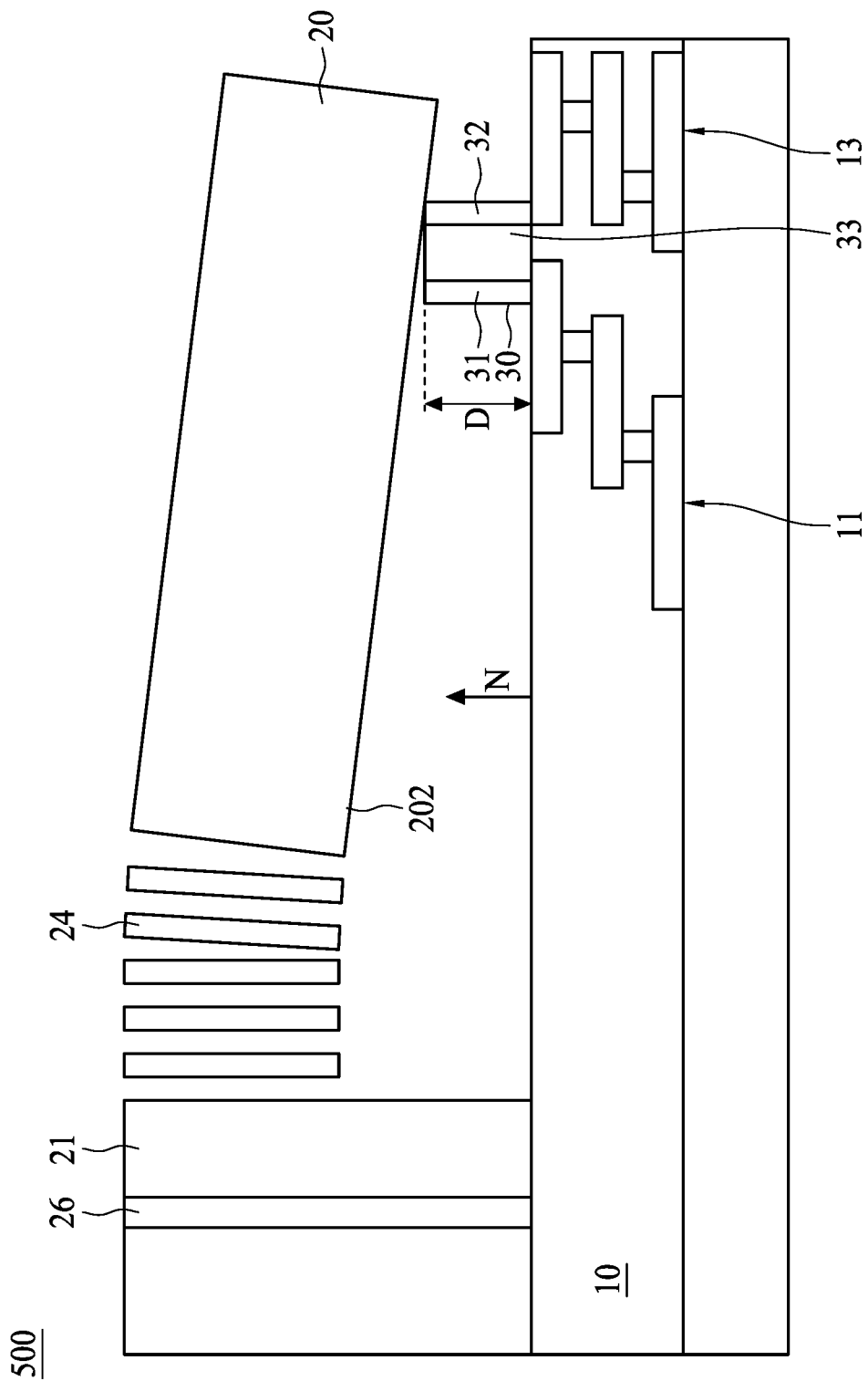
Figure 5C:
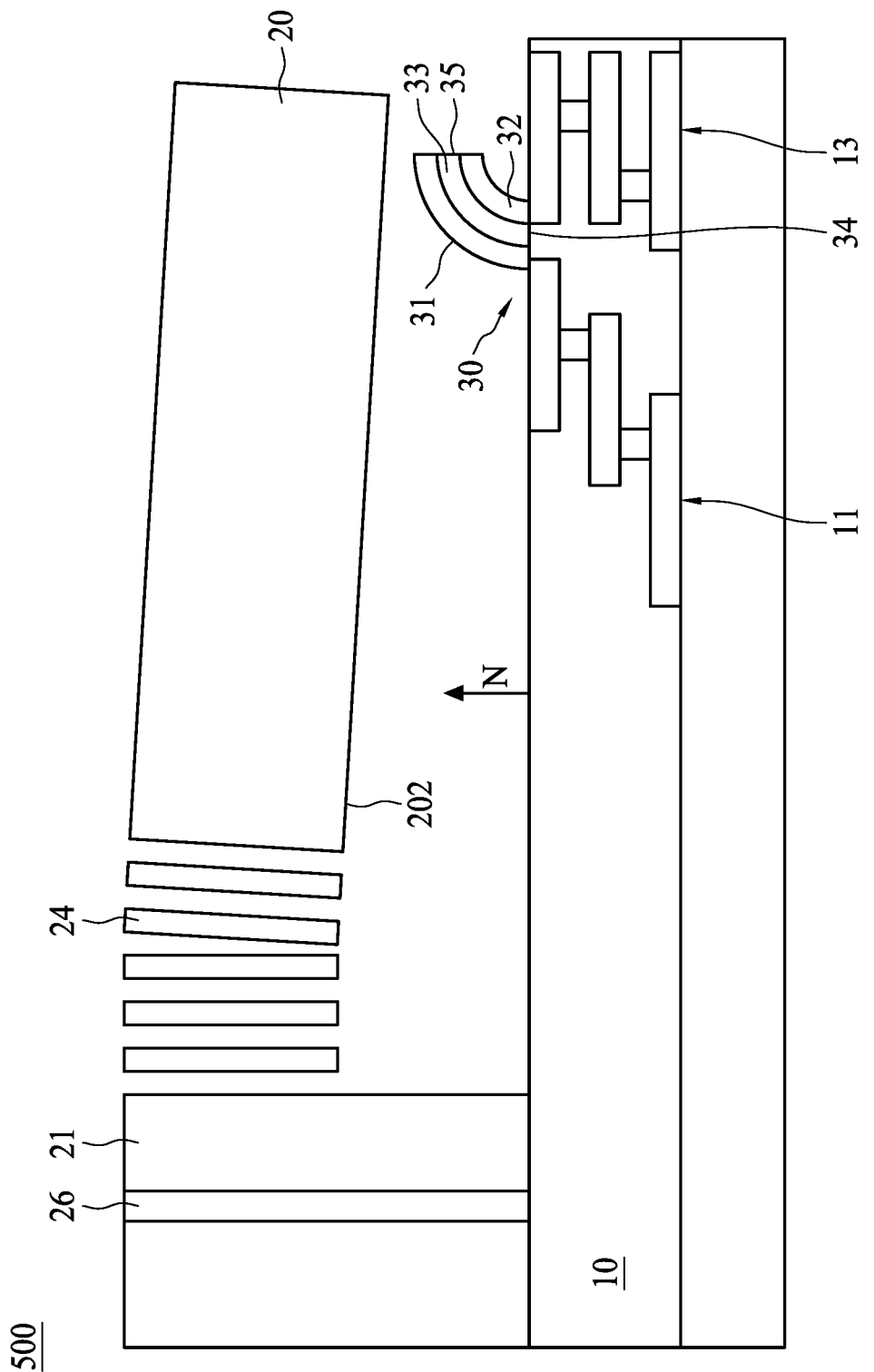

FIGS. 5A to 5C are partial cross-sectional views illustrating a MEMS device 500 according to aspects of the present disclosure in some embodiments. In some embodiments, the first electrode 31, the second electrode 32 and the piezoelectric feature 33 of the piezoelectric bump 30 are stacked in a direction substantially parallel to the first surface 101 of the first substrate 10. As shown in FIG. 5A, the piezoelectric bump 30 extends a distance D from the first surface 101 of the first substrate 10 toward the proof mass 20. By way of example, the distance D is about 5000 Å.

As shown in FIG. 5B, the proof mass 20 may move toward the first substrate 10 and make contact with the piezoelectric bump 30. When the piezoelectric bump 30 is compressed by the first substrate 10 and the proof mass 20, the piezoelectric effect occurs, and the piezoelectric bump 30 is driven to vibrate. As shown in FIG. 5C, the piezoelectric bump 30 further includes a fixed side 34 fixed to the first surface 101 of the substrate 10, and a free side 35 opposite to the fixed side 34. When the piezoelectric effect occurs, the free side 35 is forced to deviate randomly away from the proof mass 20. As such, the vibration of the piezoelectric bump 30 helps push away the proof mass 20 to alleviate stiction.

In some embodiments, the first electrode 31 and the second electrode 32 are separated from each other, and configured to receive different signals. By way of example, the first electrode 31 is electrically connected to the first conductive structure 11 to receive an electrical signal, and the second electrode 32 is electrically connected to the proof mass 20 to receive another electrical signal electrically isolated from the first conductive structure 11. The voltage potential between the first electrode 31 and the second electrode 32 can induce the piezoelectric effect in the piezoelectric feature 33, generating vibration to push the proof mass 20 away from the first substrate 10.

In some embodiments, as shown in FIGS. 5A to 5C, the substrate 10 further includes a second conductive structure 13 electrically isolated from the first conductive structure 11. The first electrode 31 is electrically connected to the first conductive structure 11 to receive an electrical signal, and the second electrode 32 is electrically connected to the second conductive structure 13 to receive another electrical signal. The voltage potential between the first electrode 31 and the second electrode 32 can induce the piezoelectric effect in the piezoelectric feature 33, generating vibration to push the proof mass 20 away from the first substrate 10.

Figure 6:
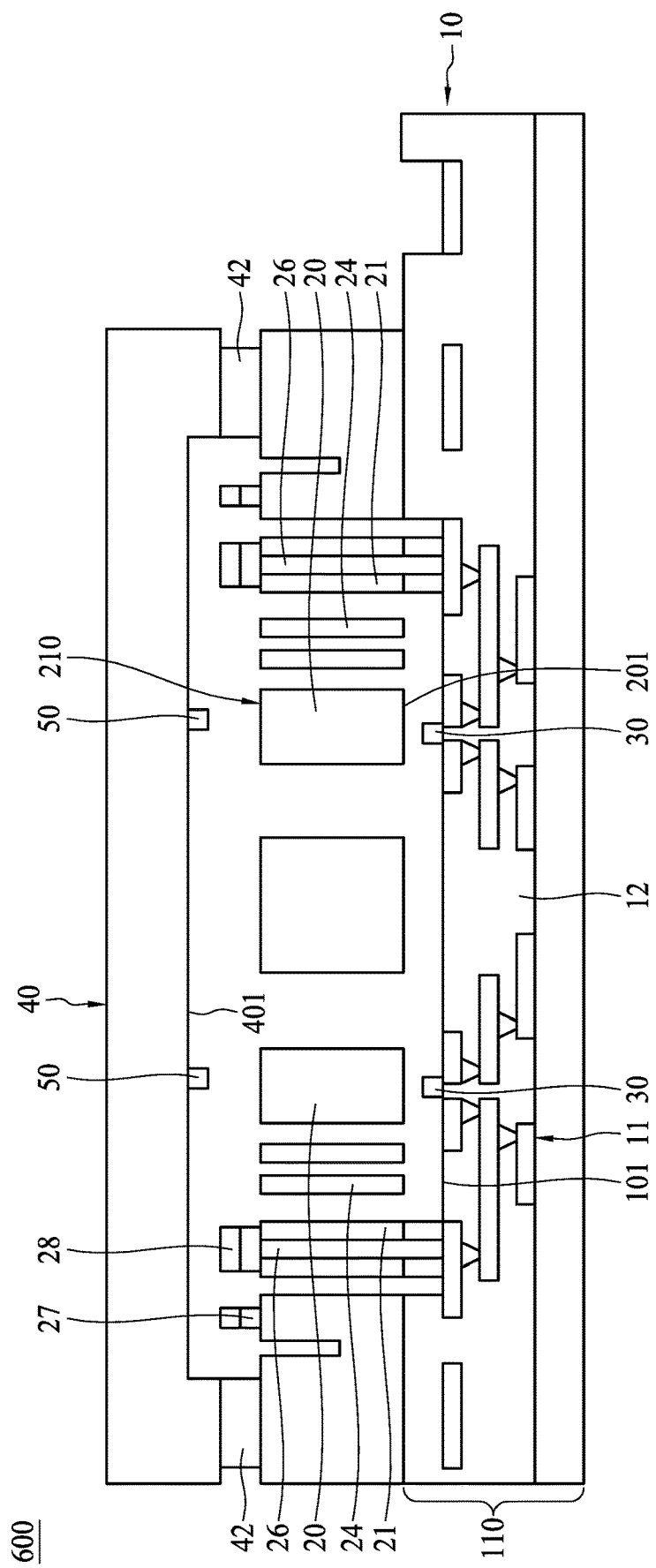
FIG. 6 is a schematic cross-sectional view of a MEMS device in accordance with some embodiments of the present disclosure.

FIG. 6 is a schematic cross-sectional view illustrating a MEMS device 600 according to aspects of the present disclosure in some embodiments. In some embodiments, as shown in FIG. 6, a second piezoelectric bump 50 is disposed on the inner surface 401 of the cover 40 and extends a distance from the inner surface 401 of the cover 40 toward the proof mass 20. The second piezoelectric bump 50 is configured to separate the proof mass 20 from the cover 40. In some embodiments, when the proof mass 20 moves toward the cover 40, the second piezoelectric bump 50 contacts the proof mass 20. The second piezoelectric bump 50 may receive a signal from the cover 40 when the proof mass 20 makes contact with the second piezoelectric bump 50, and the second piezoelectric bump 50 may start to vibrate and separate the cover 40 from the proof mass 20. In some other embodiments, the second piezoelectric bump 50 may receive a signal from the cover 40, and vibrates whether the second piezoelectric bump 50 is in contact with the proof mass 20 or not. When the second piezoelectric bump 50 contacts the proof mass 20, the second piezoelectric bump 50 continuously vibrates and separates the cover 40 from the proof mass 20 to alleviate stiction. In some other embodiments, the second piezoelectric bump 50 is not provided with an electrical signal. The second piezoelectric bump 50 may be compressed by the proof mass 20, and starts to vibrate when the mechanical energy due to compression converts to electrical energy.

The second piezoelectric bump 50 may include a first electrode, a second electrode, and a piezoelectric feature between the first electrode and the second electrode. In some embodiments, the first electrode, the second electrode and the piezoelectric feature of the second piezoelectric bump 50 are stacked in a direction substantially perpendicular to the inner surface 401 of the cover 40 similar to the piezoelectric bump 30 as illustrated in FIGS. 2A-2C. In some embodiments, the first electrode, the second electrode and the piezoelectric feature of the second piezoelectric bump 50 are stacked in a direction substantially parallel to the inner surface 401 of the cover 40 similar to the piezoelectric bump 30 as illustrated in FIGS. 5A-5C. Material and configuration of the second piezoelectric bump 50 may be similar to or different from the material and configuration of the piezoelectric bump 30, and the details of the material and configuration of the second piezoelectric bump 50 are omitted herein for brevity.

Figure 7:
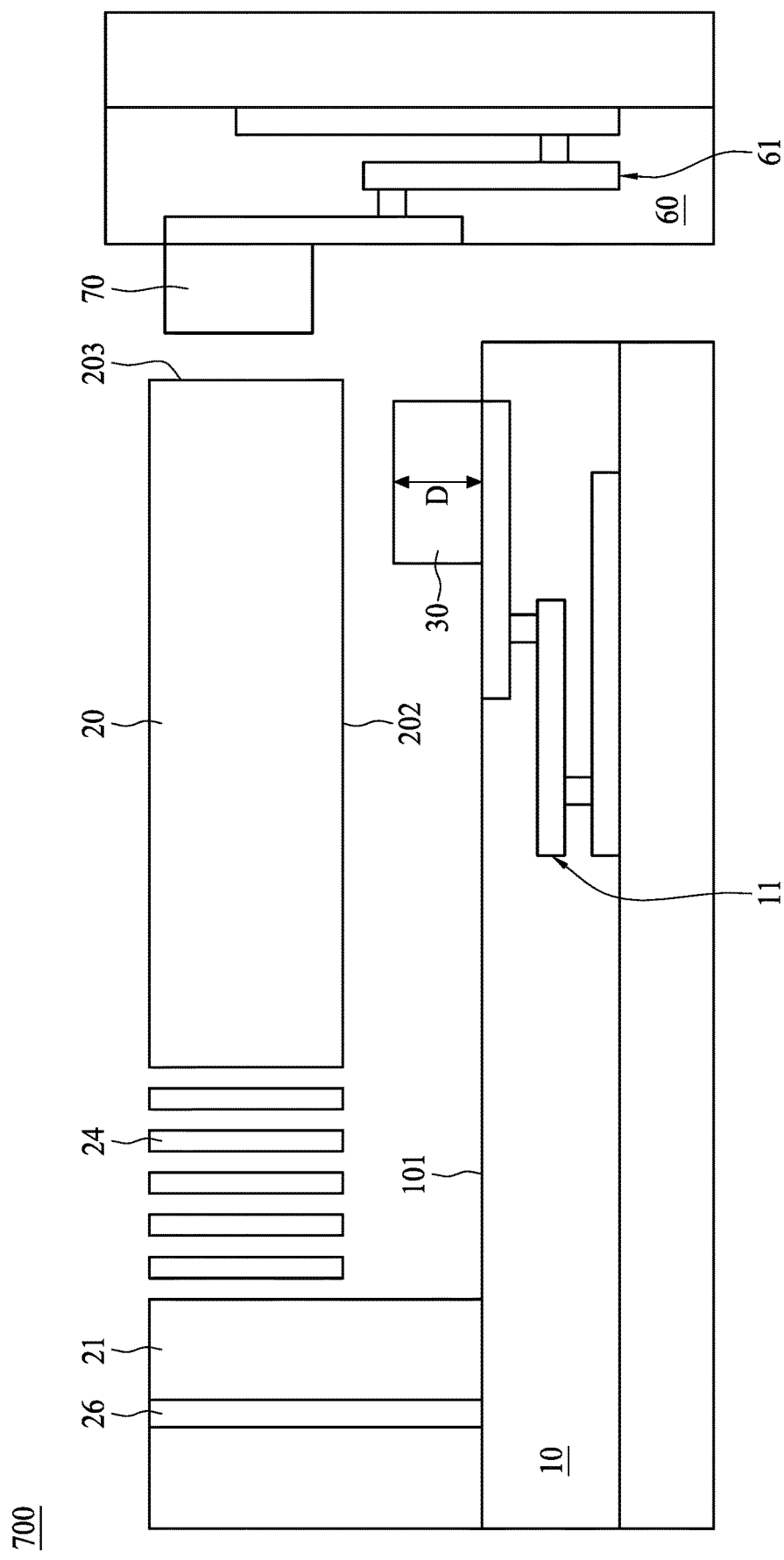
FIG. 7 is a schematic cross-sectional view of a MEMS device in accordance with some embodiments of the present disclosure.

FIG. 7 is a schematic cross-sectional view illustrating a MEMS device 700 according to aspects of the present disclosure in some embodiments. In some embodiments, as shown in FIG. 7, the MEMS device 700 further includes a second substrate 60 disposed beside a side surface 203 of the proof mass 20, and the second piezoelectric bump 70 is disposed between the second substrate 60 and the side surface 203 of the proof mass 20. The second piezoelectric bump 70 may be disposed on the second substrate 60 or disposed on the side surface 203 of the proof mass 20. In some embodiments, the second substrate 60 includes a conductive structure 61, and the second piezoelectric bump 70 is electrically connected to the conductive structure 61. In some other embodiments, the MEMS device 700 may further include a plurality of second substrates 60 disposed beside each side of the proof mass 20, and the second piezoelectric bumps 70 may be disposed between each of the second substrates 60 and the proof mass 20. Material, configuration, way of receiving signals and way of causing vibration of the second piezoelectric bump 70 may be similar to or different from those of the piezoelectric bump 30, and such details of the second piezoelectric bump 70 are omitted herein for brevity.

Accordingly, some embodiments of the present disclosure provide a MEMS device. The MEMS device includes a substrate, a proof mass, and a piezoelectric bump. The substrate has a surface. The proof mass is suspended over the surface of the substrate, wherein the proof mass is movable with respect to the substrate. The piezoelectric bump is disposed on the surface of the substrate and extends a distance from the surface of the substrate toward the proof mass. Consequently, the piezoelectric bump functions to separate the substrate and the proof mass, and as a result, the MEMS devices of the present disclosure may not suffer from stiction problems and therefore exhibits improved reliability.

Some embodiments of the present disclosure provide a MEMS device including a substrate having a surface, and a proof mass suspended over the surface of the substrate, wherein the proof mass is movable with respect to the substrate. The MEMS device further includes a piezoelectric bump disposed on the surface of the substrate and extending a distance from the surface of the substrate toward the proof mass.

Some embodiments of the present disclosure provide a MEMS device including a substrate having a first surface, and a proof mass having a fulcrum. The proof mass has a second surface facing the first surface of the substrate. The proof mass is suspended over the first surface of the substrate by the fulcrum, and the proof mass is rotatable about the fulcrum. The MEMS device further includes a piezoelectric bump disposed between the first surface of the substrate and the second surface of the proof mass.

Some embodiments of the present disclosure provide a MEMS device including a first structure and a second structure opposite to the first structure, wherein at least one of the first structure and the second structure is movable with respect to the other. The MEMS device further includes a vibration bump disposed between the first structure and the second structure, wherein the vibration bump serves to separate the first structure and the second structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A micro-electro-mechanical system (MEMS) device, comprising:
    a substrate having a first surface;
    a proof mass suspended over the first surface of the substrate and having a second surface facing the first surface of the first substrate, wherein the proof mass is movable with respect to the substrate; and
    a first piezoelectric bump disposed on the first surface of the substrate and extending a distance from the first surface of the substrate toward the proof mass, wherein the first piezoelectric bump is disposed between the first surface of the substrate and the second surface of the proof mass, and is disconnected from the proof mass, and
    wherein the first piezoelectric bump comprises:
    a first electrode;
    a second electrode; and
    a piezoelectric feature between the first electrode and the second electrode.

2. The MEMS device of claim 1, further comprising a fulcrum connecting the proof mass to the substrate, wherein the proof mass is configured to rotate about the fulcrum.

3. The MEMS device of claim 1, wherein the first electrode, the second electrode and the piezoelectric feature are stacked in a direction parallel to the first surface of the substrate.

4. The MEMS device of claim 1, wherein the first electrode, the second electrode and the piezoelectric feature are stacked in a direction perpendicular to the first surface of the substrate.

5. The MEMS device of claim 1, wherein the first electrode and the second electrode are separated from each other, and configured to receive different signals.

6. The MEMS device of claim 1, wherein the substrate further includes a first conductive structure electrically connected to the first electrode, and a second conductive structure electrically connected to the second electrode.

7. The MEMS device of claim 1, further comprising:
    a cover over and separated from the proof mass, wherein the cover has an inner surface facing the proof mass; and
    a second piezoelectric bump disposed on the inner surface of the cover and extending a distance from the inner surface of the cover toward the proof mass.

8. The MEMS device of claim 7, wherein the second piezoelectric bump comprises:
- a first electrode;
- a second electrode; and
- a piezoelectric feature between the first electrode and the second electrode.

9. A micro-electro-mechanical system (MEMS) device, comprising:
- a first substrate having a first surface;
- a proof mass having a fulcrum, the proof mass having a second surface facing the first surface of the first substrate, wherein the proof mass is suspended over the first surface of the first substrate by the fulcrum, and the proof mass is rotatable about the fulcrum; and
- a first piezoelectric bump disposed between the first surface of the first substrate and the second surface of the proof mass, wherein the first piezoelectric bump includes a piezoelectric material.

10. The MEMS device of claim 9, wherein the first piezoelectric bump is disposed on the first surface of the first substrate.

11. The MEMS device of claim 9, wherein the first piezoelectric bump comprises:
- a first electrode;
- a second electrode; and
- a piezoelectric feature between the first electrode and the second electrode.

12. The MEMS device of claim 11, wherein the first electrode, the second electrode and the piezoelectric feature are stacked in a direction perpendicular to the first surface of the first substrate.

13. The MEMS device of claim 11, wherein the first electrode, the second electrode and the piezoelectric feature are stacked in a direction parallel to the first surface of the first substrate.

14. The MEMS device of claim 9, further comprising a second substrate disposed beside a side surface of the proof mass, and a second piezoelectric bump disposed between the second substrate and the side surface of the proof mass.

15. A micro-electro-mechanical system (MEMS) device, comprising:
- a first structure;
- a second structure opposite to the first structure, wherein at least one of the first structure and the second structure is movable with respect to the other; and
- a vibration bump disposed between the first structure and the second structure, and serving to separate the first structure and the second structure, wherein the second structure contacts the vibration bump when the second structure moves toward the first structure, and the vibration bump pushes the second structure away from the first structure when the second structure contacts the vibration bump.

16. The MEMS device of claim 15, wherein material of the vibration bump includes piezoelectric material.

17. The MEMS device of claim 16, wherein the vibration bump is caused to vibrate when being compressed by the first structure and the second structure.

18. The MEMS device of claim 15, wherein the vibration bump comprises:
- a first electrode;
- a second electrode; and
- a piezoelectric feature between the first electrode and the second electrode.

19. The MEMS device of claim 18, wherein the vibration bump is caused to vibrate by applying a voltage difference between the first electrode and the second electrode.

20. The MEMS device of claim 18, further comprising:
- a first conductive structure embedded in the first structure and electrically connected to the first electrode; and
- a second conductive structure embedded in the first structure and electrically connected to the second electrode.

* * * * *